(12) United States Patent
Jeong

(10) Patent No.: US 8,446,789 B2
(45) Date of Patent: May 21, 2013

(54) GLOBAL LINE SHARING CIRCUIT OF SEMICONDUCTOR MEMORY DEVICE

(75) Inventor: Chun-Seok Jeong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 214 days.

(21) Appl. No.: 12/977,752

(22) Filed: Dec. 23, 2010

(65) Prior Publication Data
US 2011/0242918 A1  Oct. 6, 2011

(30) Foreign Application Priority Data
Mar. 31, 2010  (KR) .................. 10-2010-0029591

(51) Int. Cl.
*G11C 7/00* (2006.01)
(52) U.S. Cl.
USPC .............. 365/201; 365/189.011; 365/189.02; 365/189.03; 365/189.17; 365/189.18; 365/189.05; 365/191; 365/192

(58) Field of Classification Search
USPC ............... 365/201, 189.011, 189.02, 189.03, 365/189.17, 189.18, 189.05, 191, 192
See application file for complete search history.

(56) References Cited

U.S. PATENT DOCUMENTS
2009/0259425 A1* 10/2009 Ku et al. ................ 702/104

FOREIGN PATENT DOCUMENTS
KR   1019990075641   10/1999
KR   1020060124386   12/2006

\* cited by examiner

*Primary Examiner* — Fernando Hidalgo
(74) *Attorney, Agent, or Firm* — IP & T Group LLP

(57) ABSTRACT

A global line sharing circuit of a semiconductor memory device includes: a ZQ calibration unit configured to adjust an impedance of a DQ output driver; a test unit configured to control a test operation; and a shared global line coupled to and used in common by the ZQ calibration unit and the test unit.

9 Claims, 4 Drawing Sheets

GLOBAL LINE SHARING CIRCUIT OF SEMICONDUCTOR MEMORY DEVICE

CROSS-REFERENCE(S) TO RELATED APPLICATIONS

The present application claims priority of Korean Patent Application No. 10-2010-0029591, filed on Mar. 31, 2010, which is incorporated herein by reference in its entirety.

BACKGROUND OF THE INVENTION

Exemplary embodiments of the present invention relate to a semiconductor memory device, and more particularly, to a global line sharing circuit which can reduce the number of global lines provided in a peripheral region of the semiconductor memory device, thereby reducing a layout area thereof.

Semiconductor memory devices are used in various fields. In particular, semiconductor memory devices are used to store various data. Since such semiconductor memory devices are used in various portable devices, including desktop computers and notebook computers, they are desired to have features of high capacity, high speed operation, small size, and low power consumption.

A semiconductor memory device used for this purpose includes a bank region (CORE) in which cell transistors are provided to record and store data, and a peripheral region (PERI) in which control circuits are provided to control data record of the bank region.

As illustrated in FIG. 1, the peripheral region of the semiconductor memory device includes an AC peripheral region for receiving and controlling a command/address, and a DQ peripheral region for inputting or outputting data.

The peripheral region includes global lines for transferring data of the bank inputted/outputted through data pads (DQ). In addition, the peripheral region includes power planes and signal lines for transferring various control signals and test mode signals.

FIG. 1 illustrates an exemplary structure for executing a test function of a conventional semiconductor memory device.

A test mode signal is for a special function which is used to adjust a timing margin within a semiconductor memory device, change a circuit operation or a control method, or analyze several defects.

Therefore, as many kinds of the test mode signals are used, time taken to analyze defects of the semiconductor memory device is reduced. However, since global lines are provided for the test mode signals within the peripheral region, the increase of the lines causes the increase in the area of the peripheral region.

FIG. 2 illustrates another exemplary structure for executing a test function of a conventional semiconductor memory device.

Referring to FIG. 2, test mode signals the number of which is smaller than the number of test modes are provided and decoded by a test mode decoding circuit, and the decoded test mode signals are used and inputted to a test mode circuit for test purposes.

Test mode code signals TCM(#) are provided in order to use the test mode decoding circuit, and a signal TMGRP is further provided in order to latch the decoded signals. A plurality of signals TMGRP may be provided according to types of test modes.

FIG. 3 illustrates a structure for executing a ZQ calibration function of a conventional semiconductor memory device.

The ZQ calibration is a function which calibrates/adjusts an impedance of a DQ output driver by using a reference resistor (that is, a resistor at node ZQ which can be, e.g., 240 ohms) provided at the outside of the semiconductor memory device. The ZQ calibration circuit is provided within the AC peripheral region of FIG. 3, and the ZQ calibration operation is performed for a certain period of time in response to a ZQ command in an idle state in which the semiconductor memory device does not perform a read/write operation. The ZQ calibration result may be stored in a register as an N-bit digital code. The stored result is inputted to a DQ circuit within the DQ peripheral region and controls an impedance of a DQ output driver.

A plurality of global lines for transferring the test mode signals and the ZQ calibration code signals are provided within the peripheral region. The increase of the global lines causes the increase in the circuit area of the peripheral region.

SUMMARY OF THE INVENTION

An embodiment of the present invention is directed to a global line sharing circuit which can reduce the number of global lines within a peripheral region by setting signal lines to be commonly used.

In accordance with an embodiment of the present invention, a global line sharing circuit of a semiconductor memory device includes: a ZQ calibration unit configured to adjust an impedance of a DQ output driver; a test unit configured to control a test operation; and a shared global line coupled to and used in common by the ZQ calibration unit and the test unit.

In accordance with another embodiment of the present invention, a global line sharing circuit of a semiconductor memory device includes: a signal input unit configured to selectively transfer first and second code signals for a ZQ calibration operation and a test operation in response to a control signal; a ZQ calibration unit configured to adjust an impedance of a DQ output driver in response to the first code signal; and a test unit configured to control the test operation in response to the second code signal.

DESCRIPTION OF SPECIFIC EMBODIMENTS

Figure 1:
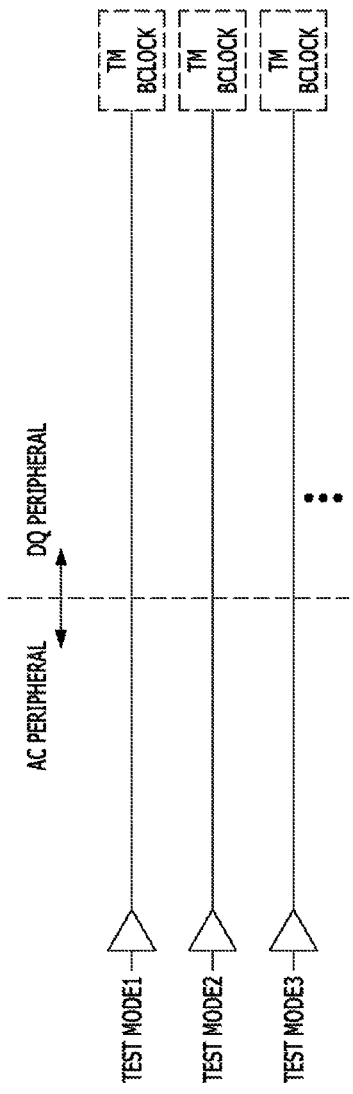
FIG. 1 illustrates an exemplary structure for executing a test function of a conventional semiconductor memory device.
Figure 2:
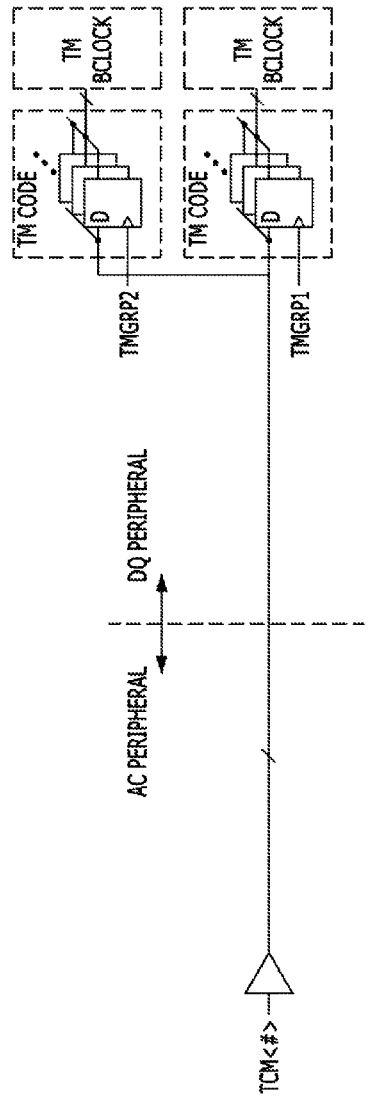
FIG. 2 illustrates another exemplary structure for executing a test function of a conventional semiconductor memory device.
Figure 3:
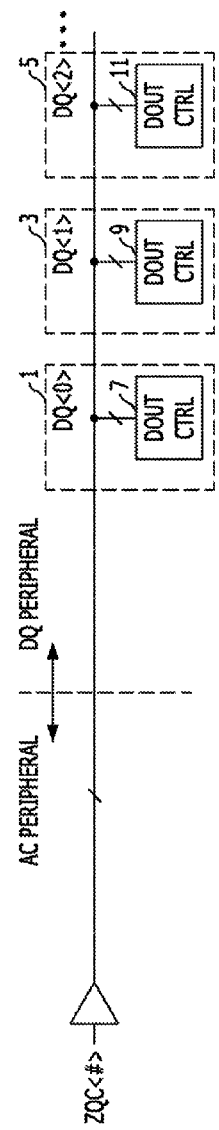
FIG. 3 illustrates a structure for executing a ZQ calibration function of a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
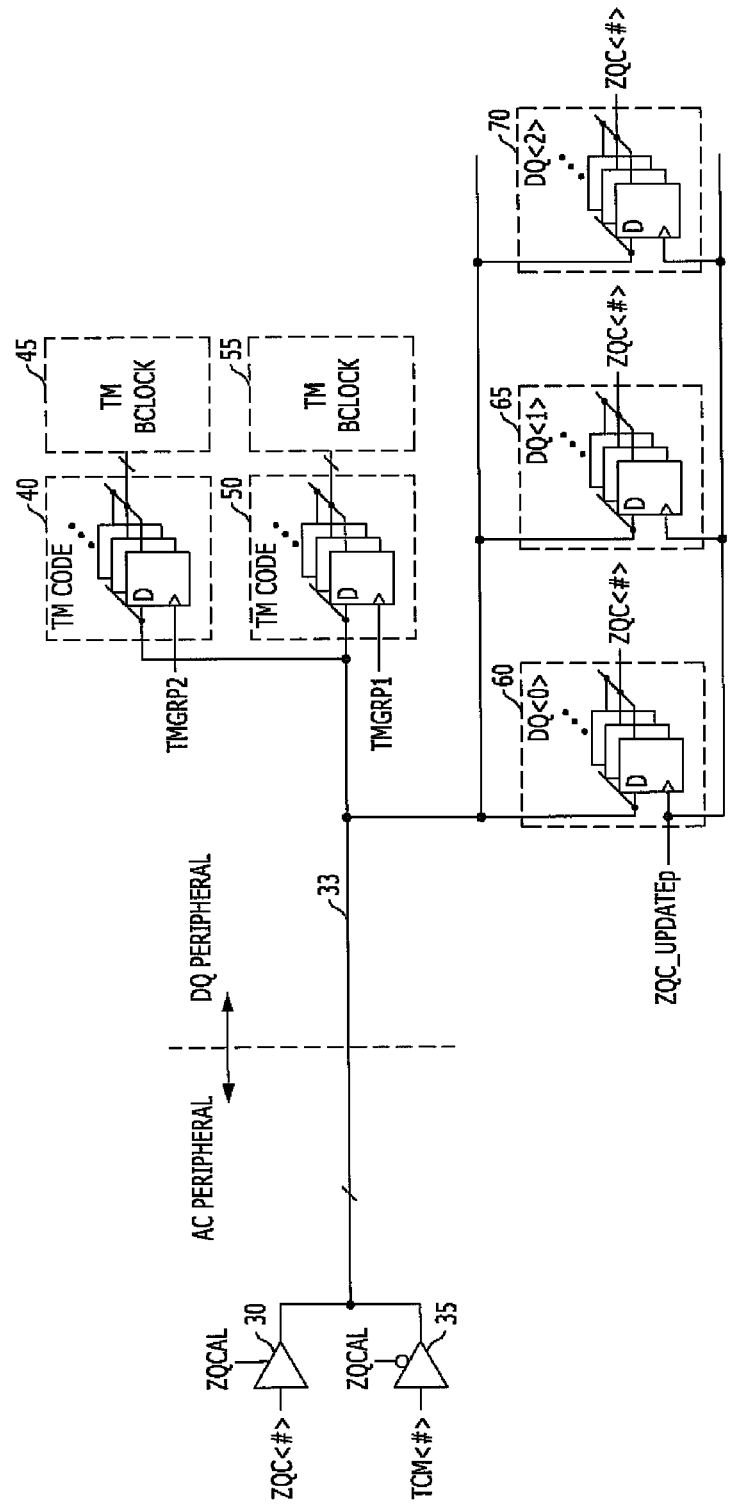
FIG. 4 illustrates a global line sharing circuit of a semiconductor memory device in accordance with an embodiment of the present invention.

FIG. 4 illustrates a global line sharing circuit of a semiconductor memory device in accordance with an embodiment of the present invention.

In this embodiment, global lines are shared for a ZQ calibration function and a test mode function.

A ZQ calibration unit for the ZQ calibration function calibrates an impedance of a DQ output driver by using a reference ZQ resistor (for example, a resistor having 240 ohms in resistance) which is provided at the outside of the semiconductor memory device. The ZQ calibration unit is provided within an AC peripheral region, and the ZQ calibration operation is performed for a certain time by a ZQ command in an idle state of the semiconductor memory device. The ZQ calibration result is stored in a register as an N-bit digital code. The stored result is inputted to a DQ circuit within a DQ peripheral region and controls an impedance of a DQ output driver.

A test unit for the test mode function has a special function which is used to adjust a timing margin within a semiconductor memory device, change a circuit operation or a control method, or analyze several defects.

In the test mode function, test mode signals, the number of which is smaller than the number of test modes, are provided and decoded by a test mode decoding circuit, and the decoded test mode signals are inputted to a test mode circuit.

Therefore, test mode code signals TCM(#) are provided in order to use the test mode decoding circuit, and a signal TMGRP is provided in order to latch the decoded signals. A plurality of signals TMGRP may be provided according to types of test modes.

In order to start performing the ZQ calibration function, the global line sharing circuit includes a first input unit 30 configured to receive a ZQ calibration code signal, and a second input unit 35 configured to receive a test mode code signal.

The first input unit 30 and the second input unit 35 are provided within an AC peripheral region. The first input unit 30 and the second input unit 35 are coupled to one end of a shared global line 33. A DQ circuit or a test mode circuit provided within a DQ peripheral region is coupled to the other end of the shared global line 33.

That is, data generated from the execution of the ZQ calibration function is transferred to the other end of the shared global line 33 within the DQ peripheral region, and DQ circuits 60, 65 and 70 for controlling an impedance of each DQ output driver are coupled to the other end of the shared global line 33. Decoding circuits 40 and 50 for decoding data for the test mode function are coupled to the other end of the shared global line 33 within the DQ peripheral region. In addition, test circuits 45 and 55 for receiving the decoded data and controlling the test operation are coupled to the decoding circuits 40 and 50.

A signal ZQC<#> inputted to the first input unit 30 represents a digital code value as the ZQ calibration result. A signal ZQCAL inputted to the first input unit 30 represents a ZQ calibration state.

When the signal ZQCAL inputted to the first input unit 30 is a high signal, the first input unit 30 is enabled and the shared global line 33 performs a calibration signal transmission operation. At this time, the semiconductor memory device has an idle state.

On the other hand, when the signal ZQCAL inputted to the first input unit 30 is a low signal, the first input unit 30 is disabled and the semiconductor memory device has a normal state. In this embodiment, the execution of the test mode function is controlled when the signal ZQCAL is in a low state.

The signal TCM<#> inputted to the second input unit 35 is a test mode code signal. The signal TCM<#> is expressed as a binary digital code value by the external input of the semiconductor memory device. The signal ZQCAL inputted to the second input unit 35 is a ZQ calibration function control signal. In this embodiment, the signal ZQCAL is also used as a test mode function control signal. That is, when the signal ZQCAL is in a low state, the second input unit 35 is enabled and the shared global line 33 is used as a signal line for the test mode function execution.

Therefore, the first input unit 30 and the second input unit 35 may be implemented with buffers having input signals, control signals, and output signals. The first input unit 30 and the second input unit 35 output the input signals according to the states of the control signals, or change the output into a high impedance state, that is, a floating state.

A signal ZQC_UPDATEp inputted to the DQ circuits 60, 65 and 70 provided within the DQ peripheral region is a pulse signal for storing update information of the signal ZQC<#> in a register. The DQ circuit may have a latch structure in which a plurality of D flip-flops are coupled to latch and store the input signals.

In addition, a signal TMGRP inputted to the decoding circuits 40 and 50 provided within the DQ peripheral region is a group test mode signal.

The operation of the global line sharing circuit in accordance with the embodiment of the present invention is described below.

When the semiconductor memory device is in a normal state, the signal ZQCAL becomes a low state. Thus, the first input unit 30 receiving the ZQ calibration code signal becomes a floating state. On the contrary, the second input unit 35 receiving the test mode code signal is enabled to output the signal TCM<#> to the shared global line 33.

The signal TCM<#> inputted through the shared global line 33 to the decoding circuits 40 and 50 is latched by the signal TMGRP and transferred to the test circuits 45 and 55. Then, the test circuits 45 and 55 perform the test control operation to adjust the timing margin within the semiconductor memory device, change the circuit operation or the control method, or analyze several defects.

When the signal ZQCAL is in a high state, the second input unit 35 becomes a floating state. On the contrary, the first input unit 30 receiving the ZQ calibration code signal is enabled to output the signal ZQC<#> to the shared global line 33.

The signal ZQC<#> inputted through the shared global line 33 to the DQ circuits 60, 65 and 70 is latched in a register provided in each DQ circuit in response to the signal ZQC_UPDATEp. The register maintains the ZQC<#> value of each DQ even though the state of the shared global line 33 is changed.

The embodiments set forth above are provided for the selective control to be achieved by sharing the global line for the test mode control and the ZQ calibration control.

In accordance with the embodiments of the present invention, the global line is used by the ZQ calibration unit and the test unit provided within the peripheral region in common. Thus, the number of the global lines within the peripheral region is reduced and thus the efficient layout is designed.

While the present invention has been described with respect to the specific embodiments, it will be apparent to those skilled in the art that various changes and modifications may be made without departing from the spirit and scope of the invention as defined in the following claims.

What is claimed is:

1. A global line sharing circuit of a semiconductor memory device, comprising:
   a first input unit coupled to a first end of a shared global line and configured to receive a ZQ calibration code signal:
   a second input unit coupled to the first end of the shared global line and configured to receive a test mode code signal;
   a ZQ calibration unit coupled to a second end of the shared global line and configured to adjust an impedance of a DQ output driver in response to the ZQ calibration code signal; and
   a test unit coupled to the second end of the shared global line and configured to control a test operation in response to the test mode code signal.

2. The global line sharing circuit of claim 1, wherein the shared global line is provided in a peripheral region of the semiconductor memory device.

3. The global line sharing circuit of claim 1, wherein the first input unit is configured to be enabled by a ZQ calibration control signal.

4. The global line sharing circuit of claim 3, wherein the first input unit comprises a buffer.

5. The global line sharing circuit of claim 1, wherein the second input unit is enabled by a ZQ calibration control signal.

6. The global line sharing circuit of claim 5, wherein the second input unit comprises a buffer.

7. The global line sharing circuit of claim 1, wherein the test mode circuit comprises:
   a decoding circuit configured to decode the test mode code signal; and
   a test circuit configured to receive the decoded test mode code signal and perform the test operation.

8. A global line sharing circuit of a semiconductor memory device, comprising:
   a signal input unit configured to selectively transfer first and second code signals for a ZQ calibration operation and a test operation, respectively, in response to a control signal;
   a ZQ calibration unit configured to adjust an impedance of a DQ output driver in response to the first code signal; and
   a test unit configured to control the test operation in response to the second code signal,
   wherein the signal input unit comprises first and second buffers respectively receiving the first and second code signals and coupled to the ZQ calibration unit and the test unit through a shared global line used by the ZQ calibration unit and the test unit.

9. The global line sharing circuit of claim 8, wherein the first and second buffers are alternatively enabled in response to the control signal.

* * * * *